United States Patent [19]

Reid

[11] Patent Number: 4,459,607
[45] Date of Patent: Jul. 10, 1984

[54] TAPE AUTOMATED WIRE BONDED INTEGRATED CIRCUIT CHIP ASSEMBLY

[75] Inventor: Gilbert R. Reid, Norristown, Pa.

[73] Assignee: Burroughs Corporation, Detroit, Mich.

[21] Appl. No.: 275,061

[22] Filed: Jun. 18, 1981

[51] Int. Cl.³ .................... H01L 23/48; H01L 39/02; H01L 23/02
[52] U.S. Cl. ...................... 357/71; 357/70; 357/80; 357/81
[58] Field of Search ............ 357/70, 71, 80, 81; 361/398

[56] References Cited

U.S. PATENT DOCUMENTS

| | | | |
|---|---|---|---|
| 3,480,836 | 11/1969 | Aronstein | 357/80 |
| 3,665,256 | 5/1972 | Goun et al. | 357/81 |
| 4,027,326 | 5/1977 | Kummer et al. | 357/71 |
| 4,259,436 | 3/1981 | Tabuchi et al. | 357/70 |

FOREIGN PATENT DOCUMENTS 55-46572  4/1980  Japan ...................... 357/70

Primary Examiner—Andrew J. James
Assistant Examiner—J. Carroll
Attorney, Agent, or Firm—Francis A. Varallo; Mervyn L. Young; Kevin R. Peterson

[57] ABSTRACT

The present disclosure describes the fabrication of subminiature electronic devices incorporating conventional integrated circuit (IC) chips or dies. The IC assembly which may be advantageously realized by tape automated bonding processes utilizes an etched double metal clad plastic carrier which allows the chip to be mounted directly to a metallic base formed on one surface of the carrier and to have its signal pads wire bonded to a metallic lead frame disposed on the opposite surface thereof.

4 Claims, 3 Drawing Figures

TAPE AUTOMATED WIRE BONDED INTEGRATED CIRCUIT CHIP ASSEMBLY

BACKGROUND OF THE INVENTION

For many years development has been proceeding in the integrated circuit (IC) packaging art which centers around tape automated bonding in which the IC chips or dies are mounted to a plastic/metal tape as the chips pass under the head of an automatic bonding machine. It has been the practice to utilize IC chips which are specially fabricated to have protruding pads to mate with the respective extremities of the lead frame. Alternately, the last mentioned extremities may have protuberances to mate with the respective chip pads. The raised areas provide the compression height required in the bonding operation. The devices made in accordance with the teachings of the present invention utilize conventional IC chips and do not require protuberances on either the chips or on the the lead frame members.

SUMMARY OF THE INVENTION

In accordance with the present invention, an etched double metal clad plastic carrier is employed which permits the chip to be mounted directly to a metal base on one carrier surface, and wires are utilized to bridge the gap between the signal pads on the chips periphery and the metal lead frame etched on the opposite carrier surface. Bonding of the wires to the chip pads and the lead frame is accomplished by automatic equipment. In effect, a plurality of subminiature IC electronic components attached to a common carrier in a tape or sheet may be made on an automatic bonder and then cut apart to provide individual elements.

An additional feature of the IC components of the present invention is that each chip is mounted directly to a metal base on the carrier, which in turn may be mounted directly to a printed circuit board or substrate providing more extensive heat sink capability. This arrangement gives excellent heat transfer, and eliminates a primary cause of failure of such components.

Another feature of the present invention is that the subminiature devices may be electrically tested prior to mounting in a system environment.

Other features and advantages of the present invention will become apparent in the detailed description of the invention which follows.

DESCRIPTION OF THE PREFERRED EMBODIMENT

Figure 1:
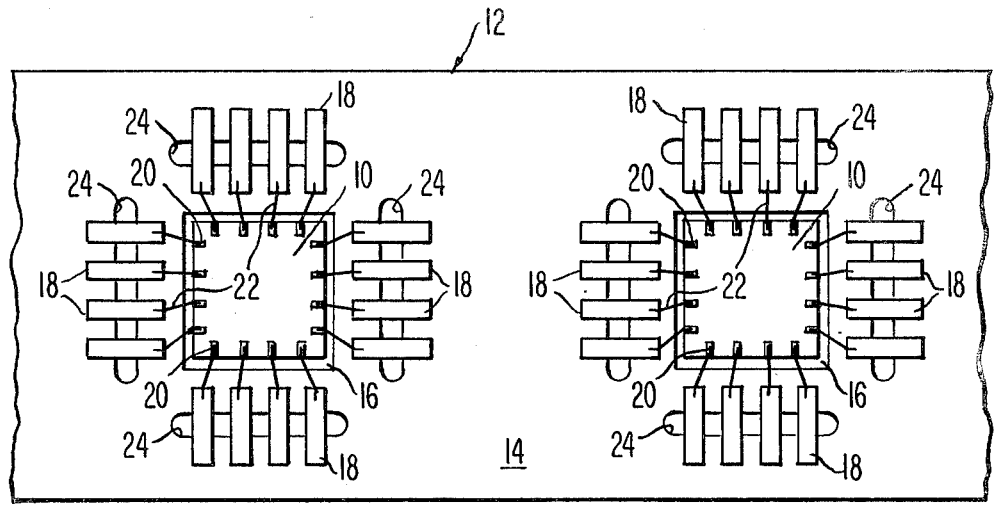
FIG. 1 is a plan view of a plurality of subminiature IC devices disposed on a plastic carrier.
Figure 2:
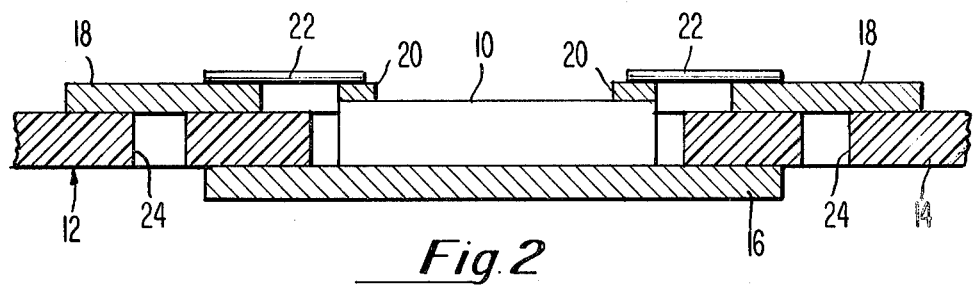
FIG. 2 is a section view of one of the devices of FIG. 1.

In FIG. 1 there is illustrated in plan view, a pair of IC chips 10 disposed on a plastic/metal carrier 12 in the form of a tape. It should be understood that the tape configuration has been chosen for purposes of example and that other carrier forms such as a sheet, may also be used. FIG. 2 is a section view of one of the chips 10 depicting with increased clarity the relationship of the chip 10 to the carrier 12.

With reference to FIGS. 1 and 2, the carrier 12 is comprised of etched double metal clad plastic, that is, a central plastic member 14 having etched metallic portions on the opposite planar surfaces thereof. One surface includes a metallic base plate 16 disposed thereon, while the opposite surface includes respective pluralities of metal conductors 18 which comprise a lead frame. A portion of the plastic member overlying the inner surface of the metallic base plate 16 is removed to create a well for receiving the chip 10. The base plate 16 serves to dissipate the heat generated within the chip 10 during operation. In order to insure optimum thermal transfer from the chip 10 to the base plate 16, the former may be attached to the latter with a heat conductive epoxy. Finally, the conductive signal pads 20 situated along the periphery of the chip 10 are electrically connected to the extremities of the lead frame conductors 18 by wires 22. The respective extremities of each of the wires 22 may be conveniently bonded to the chip pads 20 and the conductors 18 by automatic bonding equipment.

With continued reference to FIGS. 1 and 2, after the lead frame conductors 18 have been etched on the carrier surface, a narrow elongated section of plastic carrier material covering substantially the mid-portions of each group of conductors 18 is removed to expose the surfaces of the conductors. This provides a plurality of slots 24.

Figure 3:
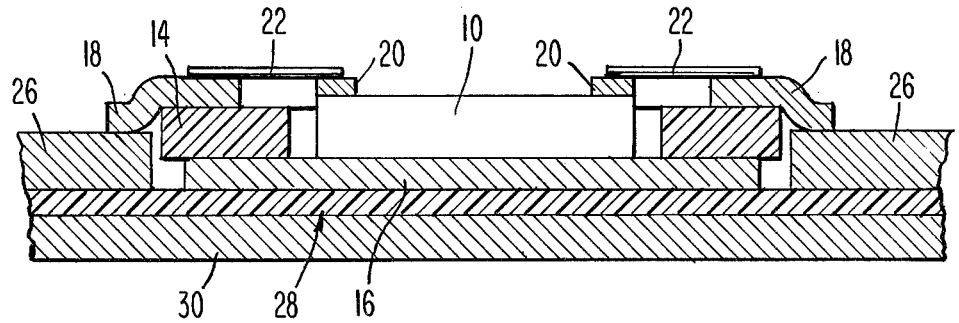
FIG. 3 is a section view of the device of FIG. 2 which has been separated from the extraneous portions of the plastic carrier and has been operatively mounted on an interconnection medium.

With additional reference to FIG. 3, one of the IC devices has been removed from the extraneous plastic carrier material by severing the conductors 18 in the areas of the elongated slots 24. This permits the free ends of the conductors 18 to be affixed, for example, by soldering, to conductive pads 26 on an interconnection medium such as a printed circuit board or a substrate 28. The latter includes a metallic heat sink 30. The outer surface of the base plate 16 bearing chip 10, is conveniently bonded to the substrate with a thermally conductive adhesive 28, thereby providing a near perfect thermal path extending from the chip surface to the outer surface of heat sink 30.

In conclusion, there has been disclosed an IC chip package assembly which is well suited for present day high density applications. The subminiature elements provided by the present invention are readily manufactured by automatic equipment, have excellent thermal characteristics, and may be electrically tested before they are mounted in a system environment. It is apparent that depending upon particular applications, changes and modifications of the assembly may be required. Such changes and modifications, insofar as they are not departures from the true scope of the invention, are intended to be covered by the claims which follow.

What is claimed is:

1. An integrated circuit assembly comprising in combination:
    an integrated circuit chip having a plurality of signal pads situated thereon;
    a tape carrier comprised of a substantially planar central insulative member and etched metallic sections on the respective opposite surfaces of said member, a first of said surfaces having a lead frame comprised of a plurality of electrical conductors etched thereon, the second of said surfaces having a base plate etched thereon;

said first of said surfaces having a rectangular opening in said central insulative member overlying a portion of said base plate, said base plate having an inner surface accessible through said opening, the latter opening providing for the mounting of said integrated circuit chip on such inner surface of said base plate;

said plurality of electrical conductors of said lead frame being comprised of groups of conductors positioned adjacent respective sides of said opening, said conductors in and such group being arranged in parallel spaced-apart relation with respect to one another and having their longitudinal axes oriented at right angles to the side of said opening adjacent thereto, an elongated aperture positioned at right angles to the longitudinal axes of the conductors in each of said groups and underlying a portion of said conductors which is intermediate the respective extremities thereof, said elongated aperture providing access means for severing the conductors to obtain free ends of said conductors devoid of said insulative member; and a plurality of wires connecting respectively said signal pads of said integrated circuit chip to the extremities of said electrical conductors opposite to said free ends thereof.

2. An integrated circuit assembly as defined in claim 1 further characterized in that said integrated circuit chip is rectangular in shape and is comprised of a a pair of parallel opposed planar faces, said plurality of signal pads being disposed along the periphery of one of said faces, the other of said faces being mounted in contiguity with said inner surface of said base plate.

3. An integrated circuit assembly as defined in claim 2 further including an interconnection medium comprised of a core of insulative material and a pair of opposed planar surfaces, a plurality of electrically conductive circuit pads disposed on one of said last-mentioned surfaces, said pads being homologously arranged with respect to said free ends of said electrical conductors of said lead frame, and means for connecting said free ends to said circuit pads.

4. An integrated circuit assembly as defined in claim 3 wherein said interconnection medium further includes a heat sink member affixed at least to that portion of the other of said surfaces of said core of insulative material which lies adjacent said base plate of said carrier, thereby providing a thermal path from said integrated circuit chip to the exterior surface of said heat sink member.

* * * * *